United States Patent [19]

Dixon

[11] Patent Number: 5,101,183
[45] Date of Patent: Mar. 31, 1992

[54] MAGNETOSTRICTIVE CLAMP

[75] Inventor: David G. Dixon, Bristol, United Kingdom

[73] Assignee: British Aerospace Public Limited Company, London, England

[21] Appl. No.: 408,185

[22] Filed: Sep. 11, 1989

[30] Foreign Application Priority Data

Sep. 9, 1988 [GB] United Kingdom ............... 8821218

[51] Int. Cl.$^5$ .................................... H01H 55/00
[52] U.S. Cl. ........................................ 335/3; 335/215
[58] Field of Search ................... 335/3, 215; 89/8; 124/3

[56] References Cited

U.S. PATENT DOCUMENTS

| | | | |
|---|---|---|---|
| 3,577,108 | 5/1971 | Bengston | 335/3 |
| 3,702,948 | 11/1972 | Balamuth | 310/8.2 |
| 3,939,448 | 2/1976 | Garshelis | 335/215 |
| 3,951,560 | 4/1976 | Beer | 403/273 |
| 3,958,450 | 5/1976 | Kleesattel | 73/573 |
| 4,347,463 | 8/1982 | Kemeny et al. | 318/135 |
| 4,383,434 | 5/1983 | Hamisch et al. | 73/651 |
| 4,390,260 | 6/1983 | Prinz | 354/65 |
| 4,677,895 | 7/1987 | Carlson et al. | 89/8 |
| 4,845,450 | 7/1989 | Porzio et al. | 335/215 |

FOREIGN PATENT DOCUMENTS

| | | | |
|---|---|---|---|
| 0331446 | 9/1989 | European Pat. Off. | 124/3 |
| 0558323 | 6/1977 | U.S.S.R. | 335/3 |
| 0760229 | 8/1980 | U.S.S.R. | 335/215 |

Primary Examiner—Steven L. Stephan
Assistant Examiner—Nilay H. Vyas
Attorney, Agent, or Firm—Cushman, Darby & Cushman

[57] ABSTRACT

Apparatus and a method for restraining the movement of members due to magnetic fields in which a clamp made of magnetostrictive materials is used.

8 Claims, 1 Drawing Sheet

MAGNETOSTRICTIVE CLAMP

BACKGROUND OF THE INVENTION

This invention relates to clamps, and relates particularly, but not exclusively, to clamps for preventing pairs of electrical power conductors from being forced apart by the magnetic fields produced when high currents flow in the conductors e.g. the conductors in railguns.

It is well known that a pair of conductors can have magnetic fields, in the presence of high pulsed currents, that cause the conductors to be forced apart. The magnetic force may permanently distort the rails and can cause solid armatures to lose intimate contact with the rails, reducing the conductivity and hence impairing efficiency. To date, the solution to this problem has been the use of extensive, usually cumbersome, mechanical clamps.

One object of the present invention is to provide clamps which advantageously utilise the adverse magnetic effects introduced by the current.

SUMMARY OF THE INVENTION

According to one aspect of the present invention, there is provided a clamping device comprising a magnetostrictive material.

Preferably, said device comprises two opposed magnetostrictive members.

Advantageously, said device comprises two opposed magnetostrictive members both of which contract lengthwise in the presence of a magnetic field, or said device comprises two opposed magnetostrictive members both of which expand lengthwise in the presence of a magnetic field.

Also advantageously, said device comprises two opposed magnetostrictive members engaged with two opposed nonmagnetostrictive members to form a generally rectangular clamp, wherein there are abutting portions of the magnetostrictive members and non-magnetostrictive members are tapered so as to cause a wedging action in the presence of a magnetic field.

Alternatively, wherein said device comprises two generally U-shaped members magnetostrictive members which are connected together at their free ends and adapted to thicken in the presence of a magnetic field.

According to a second aspect of the present invention there is provided a method of restricting relative movement of electrical conductors due to magnetic forces comprising using magnetostrictive material which deforms under the influence of a magnetic field in a manner which opposes said relative movement.

Preferably, there is provided a method further comprising placing a pair of magnetostrictive components on opposite sides of a pair of parallel electrical conductors.

BRIEF DESCRIPTION OF THE DRAWINGS

Reference will now be made by way of example to the accompanying drawings in which.

DESCRIPTION OF THE PREFERRED EMBODIMENT

Figure 1:
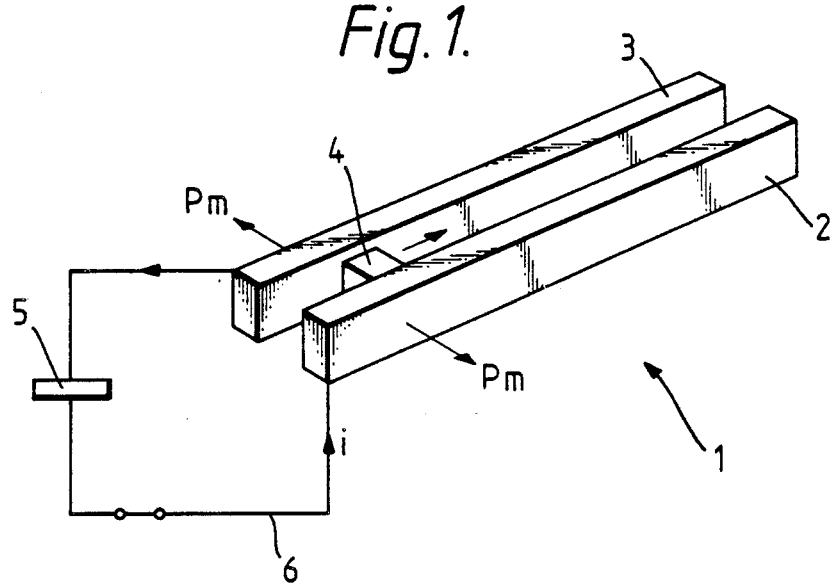
FIG. 1 is a diagram of a known electromagnetic launcher.
Figure 2:
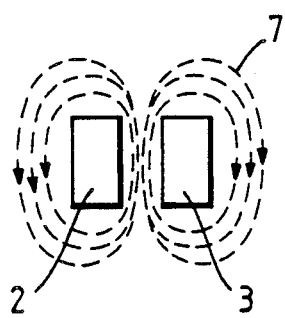
FIG. 2 is an end-on view of the railgun of FIG. 1.

Referring to FIG. 1, the illustrated launcher 1 includes two railgun rails 2 and 3, which run parallel. Situated between the rails 2 and 3 is a projectile 4 to be launched, which makes electrical contact with the rails. A pulsed power supply 5 provides a current i which flows through electric drive circuit 6, rail 2, projectile 4 and rail 3. This current generates a magnetic field 7 around each of rails 2 and 3, as is shown in FIG. 2. The magnetic field causes mutual repulsion between the rails and a magnetic force Pm acts on the rails, urging them to separate. The force Pm is proportional to the square of the current flowing in the rails, i.e. Pm $\alpha i^2$. The result of this force is that electrical contact may be broken and the conductivity and hence the efficiency of the launcher is impaired. To prevent this the railguns usually require extensive mechanical clamping (not shown).

Figure 3:
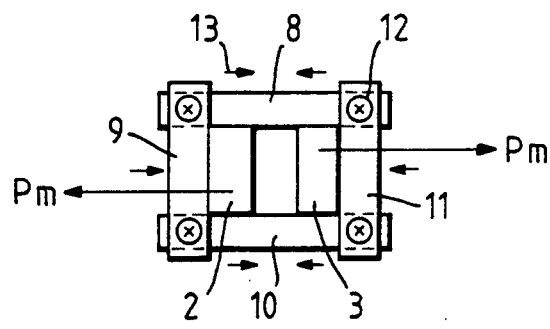
FIG. 3, 4 and 5 are diagrams of possible configurations of clamps to restrain the motion of railgun rails according to the present invention.
Figure 4:
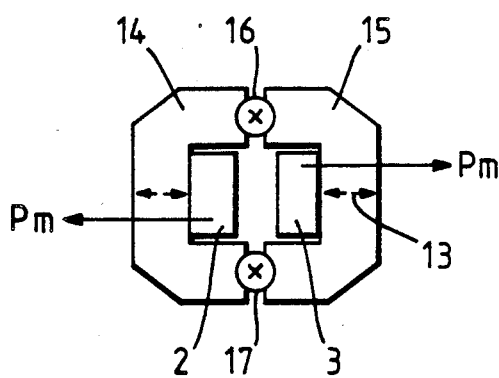
Figure 5:
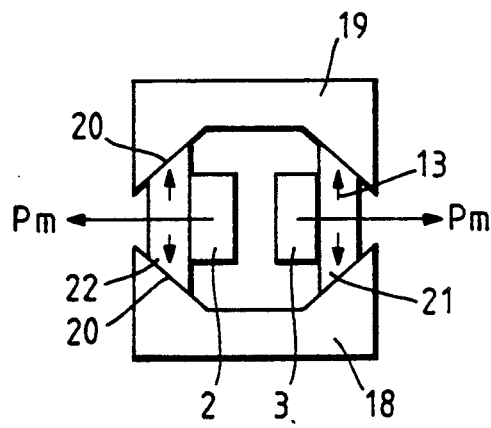

An alternative to mechanical clamping is to use magnetostrictive clamps as shown in FIGS. 3, 4 and 5. Magnetostrictive materials are ferromagnetic materials which exhibit the phenomenon of elastic deformation on the application of magnetizing forces. For examples in a magnetic field, nickel becomes longer and thinner as the field strength increases. This ability to deform can be utilised in clamping the railgun rails.

Referring to FIG. 3, two strips of magnetostrictive material 8 and 10, and two strips of non-magnetostrictive material 9 and 11, are positioned to form a rectangle around the rails, being fixed together at the four corners 12. The magnetostrictive material is aligned so that contraction occurs, in the presence of a magnetic field, in the direction indicated by arrows 13. This works in opposition to Pm as produced by the flow of current i in the railguns.

A second embodiment of the invention is illustrated in FIG. 4. Two 'U'-shaped magnetostrictive blocks 14 and 15 situated opposite each other, surround the rails 2 and 3. The blocks 14 and 15 are fixed together at points 16 and 17 and are elastically expandable as indicated by the arrows 13 in order to inhibit the movement of the rails by magnetic forces.

A third embodiment as shown in FIG. 5, comprises two supports 18 and 19 situated opposite each other and formed with tapered parts 20. Between the tapered parts 20 are two magnetostrictive strips 21 and 22 which expand, as shown by arrows 13, so as to cause a wedging action urging the magnetostrictive strips 21 and 22 to move closer together thereby inhibiting the movement of rails 2 and 3 due to force Pm.

It should be noted that any magnetostrictive material may be used to construct clamps according to the present invention. For example, amorphous metals made from various combinations of Iron, Boron, Silicon, Carbon, Nickel, Cobalt and Molybdenum, such as $Fe_{78} B_{13} Si_9$ or $CO_{66} Si_{15} B_{14} Fe_4 Ni$ may be used. Also Ferromagnetic materials are often magnetostrictive and may be used. Materials that either contract or expand, under the influence of magnetic fields may be used in this application according to requirements.

It should further be noted that the pulsed power supply 5, may be replaced by a capacitor which is charged and then discharges through the circuit, thereby also producing a current which similarly produces a magnetic force Pm.

This invention has been described with regard to electromagnetic launchers, however it will also apply to any pulsed electric circuit where conductors run close to each other or to pulsed rails. The invention is also applicable to clamps for inhibiting the movement of magnetisable objects other than electrical conductors which may be subject to a magnetic field.

I claim:

1. A clamping device which clamps at least two objects, comprising at least one magnetostrictive member having a portion for clamping said objects, dimensioned and constructed to expand or contract in the presence of a magnetic field to exert a force on said portion wherein said device comprises two spaced apart magnetostrictive members both of which contract lengthwise in the presence of a magnetic field, wherein said device comprises two opposed magnetostrictive members engaged with two opposed non-magnetostrictive members to form a generally rectangular clamp.

2. A clamping device according to claim 1, wherein abutting portions of the magnetostrictive members and non-magnetostrictive members include tapered portions which are assembled so as to cause a wedging action in the presence of a magnetic field.

3. A clamping device which clamps at least two objects, comprising at least one magnetostrictive member having a portion for clamping said objects, dimensioned and constructed to expand or contract in the presence of a magnetic field to exert a force on said portion, wherein said device comprises two generally U-shaped magnetostrictive members which are connected together at their free ends and adapted to thickness in the presence of a magnetic field.

4. A method of restricting relative movement of electrical conductors due to magnetic forces comprising the steps of
   providing a magnetostrictive material of a type which deforms under the influence of a magnetic field; and
   forming a clamp between said electrical conductors using said material, such that it deforms under said magnetic field in a manner which opposes said relative movement.

5. A method according to claim 4 comprising the further step of placing a pair of magnetostrictive components on opposite sides of a pair of parallel electrical conductors.

6. A method as in claim 4 comprising the further step of energizing said electrical conductors to cause a magnetic force and deform said magnetostrictive material.

7. A clamping device for clamping between at least two objects which, when energized cause a magnetic field which causes a first force between said objects, comprising:
   a clamping structure, including means for coupling to said at least two objects, formed of a magnetostrictive material of a type which causes a second force, opposite to said first force, between said objects in the presence of said magnetic field.

8. A clamping device, comprising:
   at least two objects which, when energized cause a magnetic field which causes a first force between said objects; and
   a clamping structure, including means for coupling to said at least two objects, formed of a magnetostrictive material of a type which causes a second force, opposite to said first force, between said objects in the presence of said magnetic field.

* * * * *